US008627720B2

(12) United States Patent
Kautzsch et al.

(10) Patent No.: US 8,627,720 B2
(45) Date of Patent: *Jan. 14, 2014

(54) ACCELERATION SENSOR

(75) Inventors: Thoralf Kautzsch, Dresden (DE); Bernhard Winkler, Regensburg (DE); Dirk Meinhold, Dresden (DE); Ben Rosam, Dresden (DE); Bernd Foeste, Dresden (DE); Andreas Thamm, Dresden (DE); Boris Binder, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/612,042

(22) Filed: Sep. 12, 2012

(65) Prior Publication Data

US 2013/0001712 A1 Jan. 3, 2013

Related U.S. Application Data

(63) Continuation of application No. 12/361,212, filed on Jan. 28, 2009, now Pat. No. 8,266,962.

(51) Int. Cl.
*G01P 15/125* (2006.01)
*H01L 29/84* (2006.01)
*H01L 21/02* (2006.01)

(52) U.S. Cl.
USPC ............. 73/514.32; 257/415; 257/E29.324; 257/E21.002; 438/50

(58) Field of Classification Search
USPC ...................................... 73/514.32
See application file for complete search history.

(56) References Cited

U.S. PATENT DOCUMENTS

| 5,461,916 | A | 10/1995 | Fujii et al. |
| 5,659,195 | A | 8/1997 | Kaiser et al. |
| 5,798,283 | A | 8/1998 | Montague et al. |
| 6,104,073 | A | 8/2000 | Ferrari et al. |
| 6,232,140 | B1 | 5/2001 | Ferrari et al. |
| 6,389,899 | B1 | 5/2002 | Partridge et al. |
| 6,829,937 | B2 | 12/2004 | Mahon |
| 6,862,795 | B2 | 3/2005 | Mahon |
| 6,906,384 | B2 | 6/2005 | Yamada et al. |
| 7,015,147 | B2 | 3/2006 | Lee et al. |
| 7,078,298 | B2 | 7/2006 | Lee et al. |
| 7,160,771 | B2 | 1/2007 | Chou et al. |
| 8,266,962 | B2 * | 9/2012 | Kautzsch et al. .......... 73/514.32 |
| 2003/0138986 | A1 | 7/2003 | Bruner |
| 2006/0134818 | A1 | 6/2006 | Cunningham et al. |
| 2007/0062286 | A1 | 3/2007 | Lehtonen et al. |
| 2009/0017579 | A1 | 1/2009 | Jeong et al. |

OTHER PUBLICATIONS

"Fabrication of Silicon-on-Nothing Structure by Substrate Engineering Using the Empty-Space-in-Silicon Formation Technique", Tsutomu Sato, et al., Japanese Journal of Applied Physics, vol. 43, No. 1, 2004, pp. 12-18.
Office Action mailed Aug. 29, 2011 in U.S. Appl. No. 12/361,212.
Office Action mailed Apr. 14, 2011 in U.S. Appl. No. 12/361,212.
"Progress in Power ICs and MEMS, "Analog" Technologies to Interface the Real World", Claudio Contiero, et al., International Symposium on Power Semiconductor Devices & ICs, 2004, pp. 3-12.

* cited by examiner

*Primary Examiner* — Hezron E Williams
*Assistant Examiner* — Gregory J Redmann
(74) *Attorney, Agent, or Firm* — Dicke, Billig & Czaja, PLLC

(57) ABSTRACT

A semiconductor device includes a semiconductor substrate and a semiconductor mass element configured to move in response to an applied acceleration. The mass element is defined by trenches etched into the semiconductor substrate and a cavity below the mass element. The semiconductor device includes a sensing element configured to sense movement of the mass element.

25 Claims, 15 Drawing Sheets

ACCELERATION SENSOR

CROSS-REFERENCE TO RELATED APPLICATIONS

This Utility Patent Application is a continuation application of U.S. application Ser. No. 12/361,212, filed Jan. 28, 2009, which is incorporated herein by reference.

BACKGROUND

Acceleration sensors are typically used to measure the acceleration or movement of an object in which the acceleration sensor is installed. Acceleration sensors typically provide an output signal that varies based on the acceleration sensed by the acceleration sensor. Acceleration sensors are typically available as separate components, which may be connected to an Application-Specific Integrated Circuit (ASIC) or another suitable circuit. The acceleration sensors are typically expensive to manufacture and to connect with an ASIC. In addition, the acceleration sensors are typically not compatible with a Complementary Metal-Oxide-Semiconductor (CMOS) process, and therefore cannot be integrated on a single integrated circuit with an ASIC.

For these and other reasons, there is a need for the present invention.

SUMMARY

One embodiment provides a semiconductor device. The semiconductor device includes a semiconductor substrate and a semiconductor mass element configured to move in response to an applied acceleration. The mass element is defined by trenches etched into the semiconductor substrate and a cavity below the mass element. The semiconductor device includes a sensing element configured to sense movement of the mass element.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
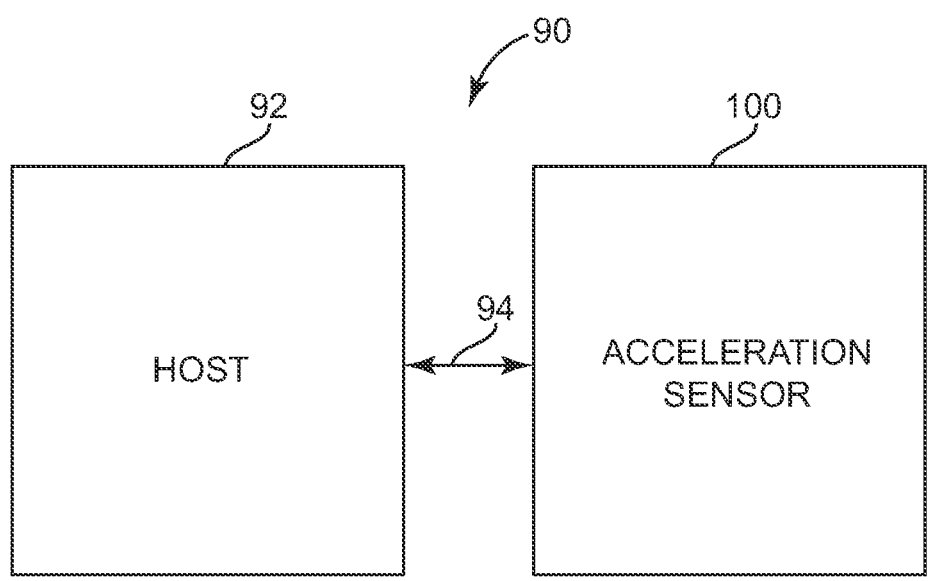
FIG. 1 is a block diagram illustrating one embodiment of a system.

FIG. 1 is a block diagram illustrating one embodiment of a system 90. System 90 includes a host 92 and an acceleration sensor 100. Host 92 is communicatively coupled to acceleration sensor 100 through communication link 94. Host 92 includes a microprocessor, computer, controller, or any other suitable device for receiving data from acceleration sensor 100. Acceleration sensor 100 communicates acceleration data to host 92 though communication link 94. In one embodiment, communication link 94 is a wireless communication link. In one embodiment, system 90 is part of an automobile and acceleration sensor 100 is installed in an automotive component, such as an airbag or tire. In another embodiment, system 90 is a portable electronic device and acceleration sensor 100 is used to detect movement of the portable electronic device for managing battery power.

In one embodiment, acceleration sensor 100 is a semiconductor device. In one embodiment, acceleration sensor 100 is integrated as a buried structure on an Application-Specific Integrated Circuit (ASIC). Acceleration sensor 100 is fabricated by forming a cavity in a semiconductor substrate, such as a silicon substrate. The cavity is formed using a sacrificial material layer that is later removed or by using a Venezia or silicon on nothing process or another suitable process. The cavity is epitactically overgrown with several micrometers of silicon. A deep trench process is then used to expose the cavity and form a mass element from the volume of semiconductor material above the cavity. The mass element remains connected to the substrate by a narrow semiconductor material portion. The walls of the trenches are doped and isolated from each other by counterdoping. The mass element and substrate are then covered with a stack including an oxide layer and a polysilicon layer or another suitable material layer over the oxide layer. The oxide layer is then removed to complete the acceleration sensor. This process for fabricating the acceleration sensor provides a higher degree of freedom in structuring the oscillating mass element compared to typical methods. In addition, more compact and contiguous silicon blocks may be formed. In addition, a Complementary Metal-Oxide-Semiconductor (CMOS) circuit may be fabricated on the substrate following the acceleration sensor fabrication.

As used herein, the term "electrically coupled" is not meant to mean that the elements must be directly coupled together and intervening elements may be provided between the "electrically coupled" elements.

Figure 2:
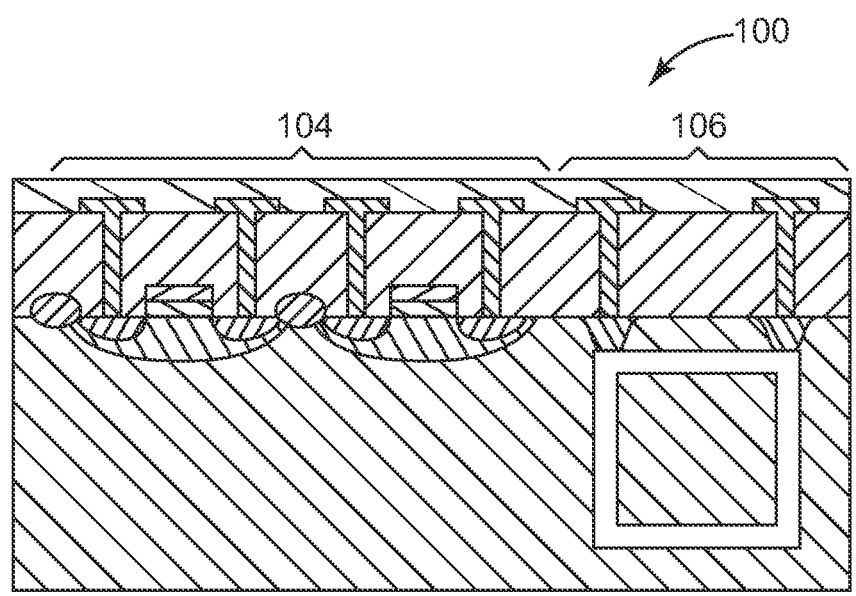
FIG. 2 illustrates a cross-sectional view of one embodiment of an Application Specific Integrated Circuit (ASIC) including an acceleration sensor and a Complementary Metal-Oxide-Semiconductor (CMOS) circuit.

FIG. 2 illustrates a cross-sectional view of one embodiment of an ASIC 100 including an acceleration sensor 106 and a Complementary Metal-Oxide-Semiconductor (CMOS) circuit 104. In one embodiment, ASIC 100 is fabricated by first fabricating a buried acceleration sensor 106 and then fabricating a CMOS circuit 104 electrically coupled to acceleration sensor 106. In one embodiment, CMOS circuit 104 provides an output signal to a host indicating the acceleration sensed by acceleration sensor 106. In this way, a single chip solution for measuring acceleration is provided.

Figure 3A:
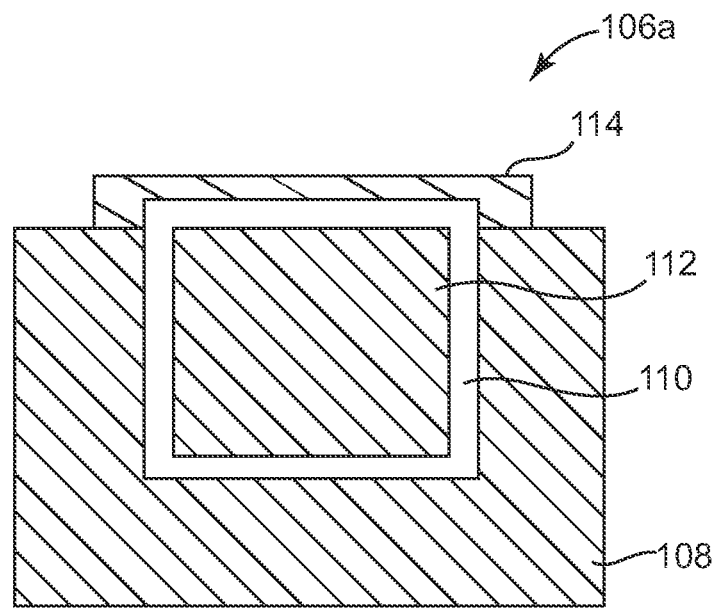
FIG. 3A illustrates a cross-sectional view of one embodiment of an acceleration sensor.
Figure 3B:
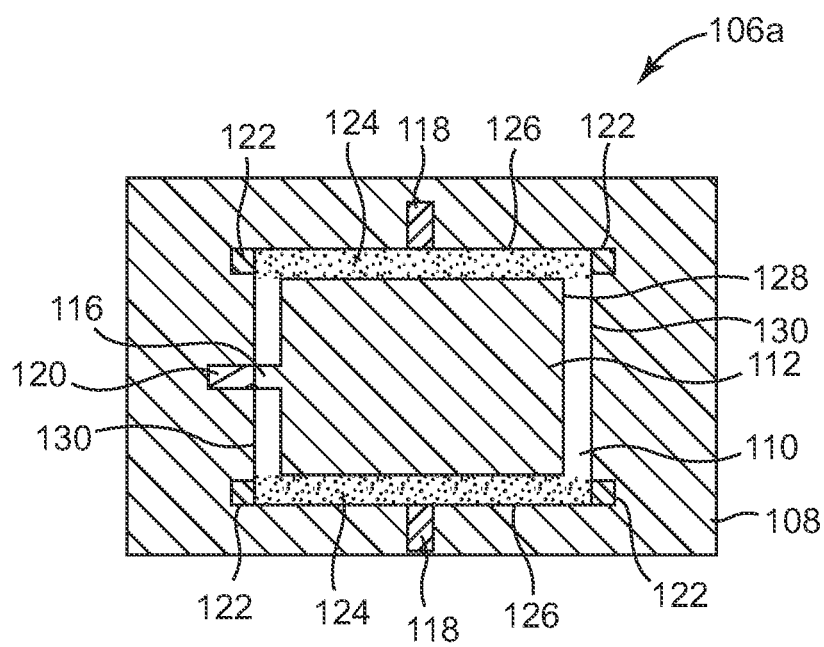
FIG. 3B illustrates a top view of one embodiment of the acceleration sensor.

FIG. 3A illustrates a cross-sectional view and FIG. 3B illustrates a top view of one embodiment of an acceleration sensor 106a. In one embodiment, acceleration sensor 106a provides acceleration sensor 106 previously described and illustrated with reference to FIG. 2. Acceleration sensor 106a includes a substrate 108, a cavity 110, a mass element 112, and a cap 114. Cap 114 includes a polysilicon plate or another suitable material.

Mass element 112 is connected to substrate 108 by a narrow semiconductor portion as indicated at 116. The narrow semiconductor portion as indicated at 116 is located at any suitable location between substrate 108 and mass element 112 such that mass element 112 is free to move on the desired axis for measuring the acceleration on the desired axis. While mass element 112 in the illustrated embodiment is substantially square or rectangular in shape, in other embodiments mass element 112 has other suitable shapes. Mass element 112 moves within cavity 110 in response to changes in applied acceleration.

Sidewalls 126 of substrate 108 in cavity 110 are perpendicular to sidewalls 130 of substrate 108 in cavity 110. Sidewalls 126 and 130 of substrate 108 in cavity 110 are parallel and opposite to sidewalls 128 of mass element 112. Sidewalls 128 of mass element 112 are doped. In one embodiment, sidewalls 128 of mass element 112 are n doped. Sidewalls 126 and 130 of substrate 108 are doped to have the same polarity as sidewalls 128 of mass element 112. In one embodiment, sidewalls 126 and 130 of substrate 108 are n doped.

Portions 124 of the bottom of cavity 110 between sidewalls 128 of mass element 112 and sidewalls 126 of substrate 108 are doped to have a polarity opposite the polarity of sidewalls 126, 128, and 130. In one embodiment, portions 124 of the bottom of cavity 110 between sidewalls 128 of mass element 112 and sidewalls 126 of substrate 108 are p doped. Corners 122 between sidewalls 126 and 130 of substrate 108 are doped to have the same polarity as portions 124 of the bottom of cavity 110 to electrically isolate sidewalls 126 from sidewalls 130. In one embodiment, corners 122 between sidewalls 126 and 130 of substrate 108 are p doped.

Connections 118 electrically couple sidewalls 126 to a circuit for measuring the movement of mass element 112. Connections 118 are doped to have the same polarity as sidewalls 126. In one embodiment, connections 118 are n doped. Connection 120 electrically couples sidewalls 128 of mass element 112 to the circuit for measuring the movement of mass element 112. Connection 120 is doped to have the same polarity as sidewalls 128 of mass element 112. In one embodiment, connection 120 is n doped. In another embodiment, the polarities of sidewalls 126, 128, and 130, portions 124 of the bottom of cavity 110, corners 122, and connections 118 and 120 are reversed, such that sidewalls 126, 128, 130 and connections 118 and 120 are p doped, and portions 124 of the bottom of cavity 110 and corners 122 are n doped.

Doped sidewalls 126 of substrate 108 and doped sidewall 128 opposite each doped sidewall 126 provide electrodes for two capacitors for sensing movement of mass element 112. In response to an applied acceleration, mass element 112 moves. The movement of mass element 112 is sensed by measuring a change in capacitance between sidewalls 128 of mass element 112 and sidewalls 126 of substrate 108.

Figure 4:
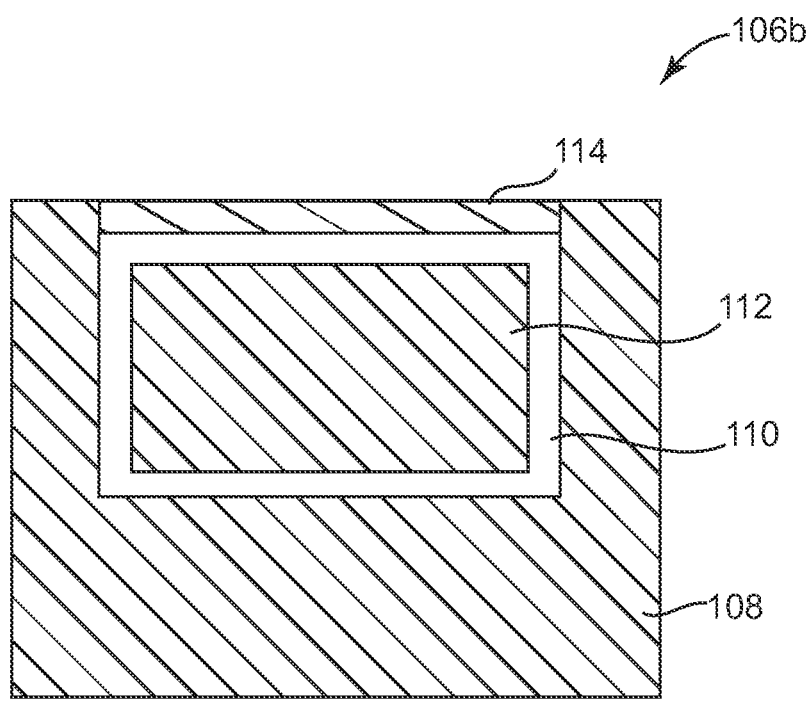
FIG. 4 illustrates a cross-sectional view of another embodiment of an acceleration sensor.

FIG. 4 illustrates a cross-sectional view of another embodiment of an acceleration sensor 106b. In one embodiment, acceleration sensor 106b provides acceleration sensor 106 previously described and illustrated with reference to FIG. 2. Acceleration sensor 106b is similar to acceleration sensor 106a previously described and illustrated with reference to FIGS. 3A and 3B, except that in acceleration sensor 106b the top of cap 114 is coplanar with the top of substrate 108. In addition, the top of mass element 112 is below the top of substrate 108.

The following FIGS. 5-19 illustrate embodiments of a method for fabricating an acceleration sensor, such as acceleration sensor 106a or 106b previously described and illustrated with reference to FIGS. 3A, 3B, and 4.

Figure 5:
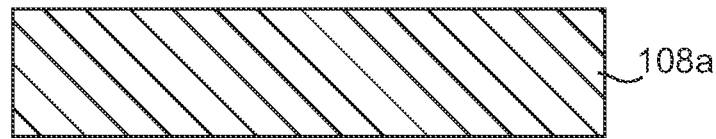
FIG. 5 illustrates a cross-sectional view of one embodiment of a substrate.

FIG. 5 illustrates a cross-sectional view of one embodiment of a substrate 108a. In one embodiment, substrate 108a is a silicon substrate, such as a silicon wafer. In other embodiments, substrate 108a is another suitable semiconductor substrate.

Figure 6:
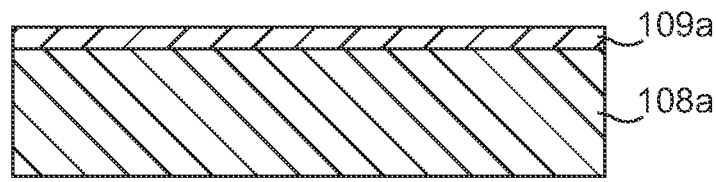
FIG. 6 illustrates a cross-sectional view of one embodiment of the substrate and a sacrificial material layer.

FIG. 6 illustrates a cross-sectional view of one embodiment of substrate 108a and a sacrificial material layer 109a. In one embodiment, an oxide, such as $SiO_2$ is grown or deposited over substrate 108a to provide sacrificial material layer 109a. In another embodiment, a semiconductor material different from substrate 108a, such as SiGe is deposited over substrate 108a to provide sacrificial material layer 109a.

Figure 7:
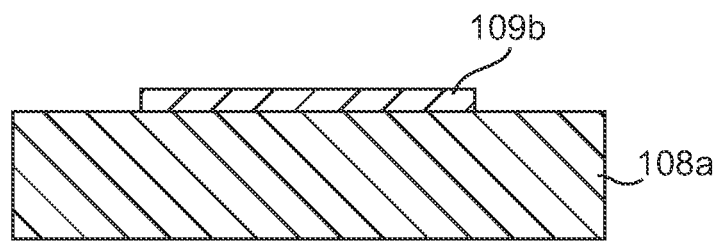
FIG. 7 illustrates a cross-sectional view of one embodiment of the substrate and the sacrificial material layer after etching a portion of the sacrificial material layer.

FIG. 7 illustrates a cross-sectional view of one embodiment of substrate 108a and sacrificial material layer 109b after etching a portion of sacrificial material layer 109a. In one embodiment, sacrificial material layer 109a is etched to expose portions of substrate 108a to provide sacrificial material layer 109b. In one embodiment, sacrificial material layer 109b defines the cavity below the mass element in subsequent processing steps.

Figure 8:
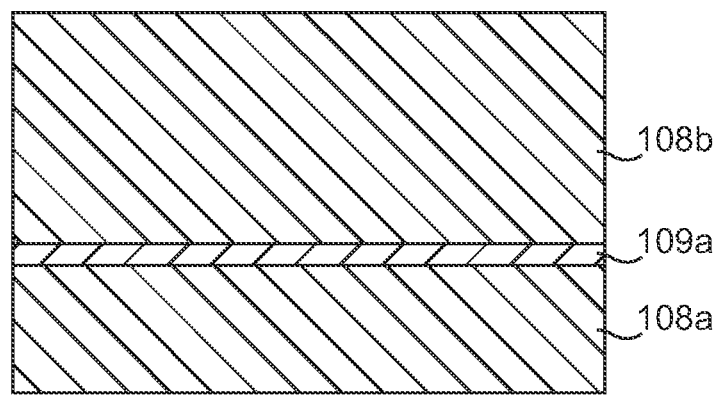
FIG. 8 illustrates a cross-sectional view of one embodiment of the substrate, the sacrificial material layer, and an epitaxial layer.

FIG. 8 illustrates a cross-sectional view of one embodiment of substrate 108a, sacrificial material layer 109a, and an epitaxial layer 108b. In this embodiment, sacrificial material layer 109a is not etched to provide sacrificial material layer 109b. A semiconductor material, such as Si or another suitable semiconductor material is deposited over sacrificial material layer 109a using selective epitaxy to provide epitaxial layer 108b.

Figure 9:
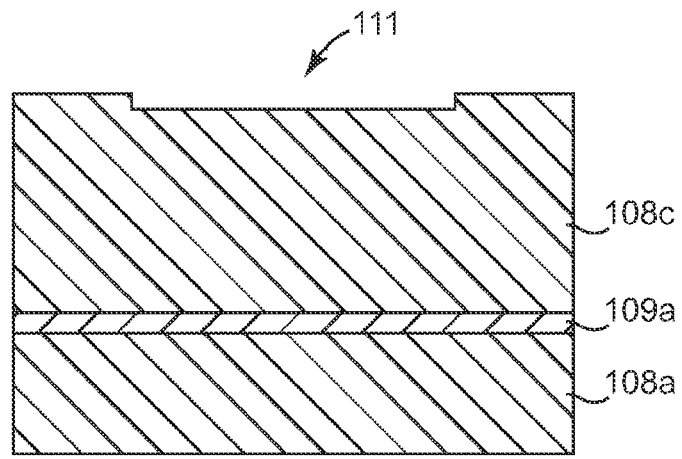
FIG. 9 illustrates a cross-sectional view of one embodiment of the substrate, the sacrificial material layer, and the epitaxial layer after etching a portion of the epitaxial layer.

FIG. 9 illustrates a cross-sectional view of one embodiment of substrate 108a, sacrificial material layer 109a, and epitaxial layer 108c after etching a portion of epitaxial layer 108b. In this embodiment, sacrificial material layer 109a is not etched to provide sacrificial material layer 109b. In this embodiment, a portion of epitaxial layer 108b is etched to provide opening 111 and epitaxial layer 108c. This embodiment is used to fabricate an acceleration sensor similar to acceleration sensor 106b previously described and illustrated with reference to FIG. 4.

Figure 10:
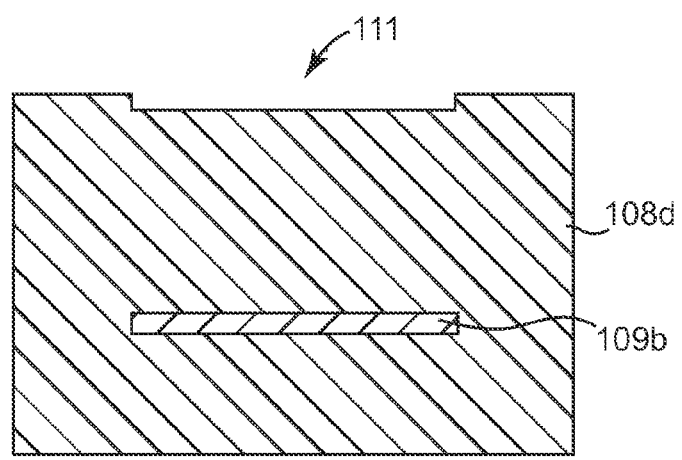
FIG. 10 illustrates a cross-sectional view of one embodiment of the substrate, the etched sacrificial material layer, and the epitaxial layer after etching a portion of the epitaxial layer.

FIG. 10 illustrates a cross-sectional view of one embodiment of substrate 108d (which includes substrate 108a and the epitaxial layer) and etched sacrificial material layer 109b after etching a portion of the epitaxial layer. In this embodiment, a portion of the epitaxial layer is etched to provide opening 111 and substrate 108d. This embodiment is also used to fabricate an acceleration sensor similar to acceleration sensor 106b previously described and illustrated with reference to FIG. 4.

Figure 11:
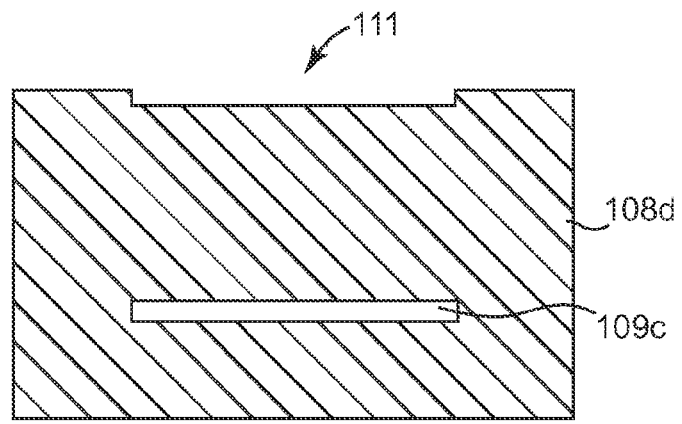
FIG. 11 illustrates a cross-sectional view of one embodiment of a substrate including a cavity formed using a silicon on nothing process.

FIG. 11 illustrates a cross-sectional view of one embodiment of a substrate 108d including a cavity 109c formed using a silicon on nothing process. In this embodiment, which may be used in place of the processes previously described and illustrated with reference to FIGS. 6-10, a cavity is formed in substrate 108a using a Venezia or silicon on nothing process to provide substrate 108d including cavity 109c. The silicon on nothing process results in cavity 109c below an opening 111 in substrate 108d.

Figure 12:
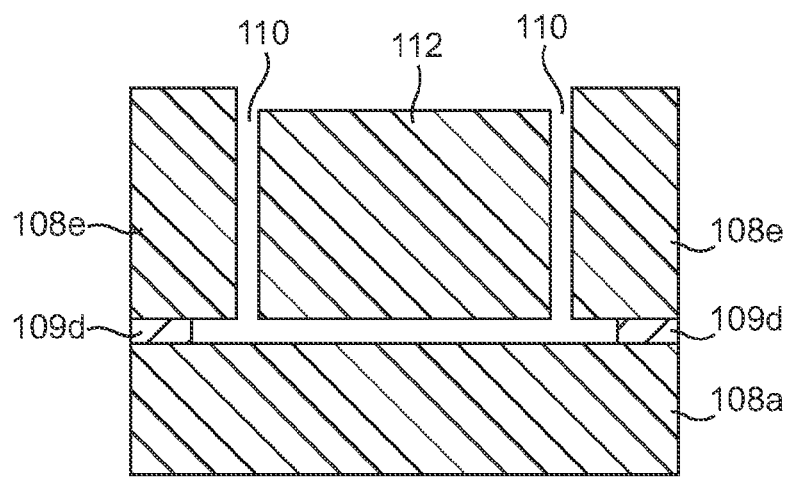
FIG. 12 illustrates a cross-sectional view of one embodiment of the substrate, the sacrificial material layer, the epitaxial layer, and a mass element after etching trenches into the epitaxial layer and removing a portion of the sacrificial material layer.

The embodiment illustrated by FIG. 12 follows the process previously described and illustrated with reference to FIG. 9. FIG. 12 illustrates a cross-sectional view of one embodiment of substrate 108a, sacrificial material layer 109d, epitaxial layer 108e, and a mass element 112 after etching trenches into epitaxial layer 108c and removing a portion of sacrificial material layer 109a. Epitaxial layer 108c is etched to expose portions of sacrificial material layer 109a to provide mass element 112 and epitaxial layer 108e. In one embodiment, a deep trench etch is used to expose portions of sacrificial material layer 109a. Mass element 112 remains connected to epitaxial layer 108e via a narrow semiconductor material portion (not shown). Sacrificial material layer 109a is then etched to remove the portion of sacrificial material under mass element 112 to provide cavity 110 and sacrificial material layer 109d. Sacrificial material layer 109a is etched using a wet etch or another suitable etch. In another embodiment, sacrificial material layer 109a is not etched and the trenches are filled or partially filled with additional sacrificial material, which is removed later in the fabrication process.

Figure 13:
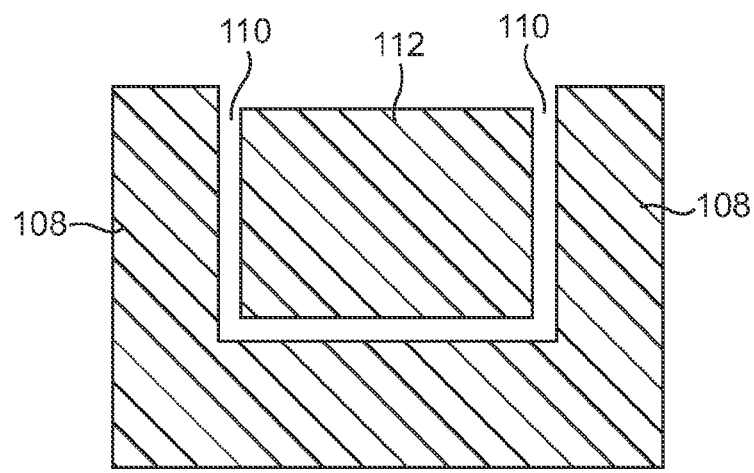
FIG. 13 illustrates a cross-sectional view of one embodiment of the substrate and a mass element after etching trenches into the substrate and removing the etched sacrificial material layer.

The embodiment illustrated by FIG. 13 follows the process previously described and illustrated with reference to FIG. 10. FIG. 13 illustrates a cross-sectional view of one embodiment of substrate 108 and a mass element 112 after etching trenches into substrate 108d and removing etched sacrificial material layer 109b. Substrate 108d is etched to expose portions of sacrificial material layer 109b to provide mass element 112 and substrate 108. In one embodiment, a deep trench etch is used to expose portions of sacrificial material layer 109b. Mass element 112 remains connected to substrate 108 via a narrow semiconductor material portion (not shown). Sacrificial material layer 109b is then removed to provide cavity 110. Sacrificial material layer 109b is removed using a wet etch or another suitable etch. In another embodiment, sacrificial material layer 109b is not etched and the trenches are filled or partially filled with additional sacrificial material, which is removed later in the fabrication process.

Figure 14:
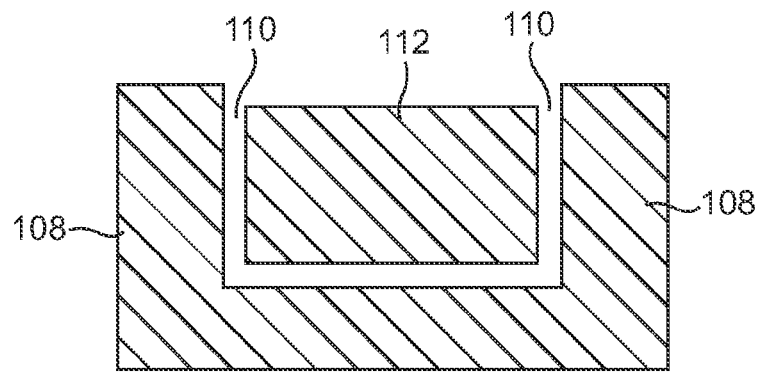
FIG. 14 illustrates a cross-sectional view of one embodiment of the substrate and a mass element after etching trenches into the substrate to expose the cavity.

The embodiment illustrated by FIG. 14 follows the process previously described and illustrated with reference to FIG. 11. FIG. 14 illustrates a cross-sectional view of one embodiment of substrate 108 and a mass element 112 after etching trenches into the substrate to expose cavity 109c. Substrate 108d is etched to expose portions of cavity 109c to provide mass element 112, substrate 108, and cavity 110. In one embodiment, a deep trench etch is used to expose portions of cavity 109c. Mass element 112 remains connected to substrate 108 via a narrow semiconductor material portion (not shown). In another embodiment, the trenches are filled or partially filled with sacrificial material, which is removed later in the fabrication process.

Figure 15:
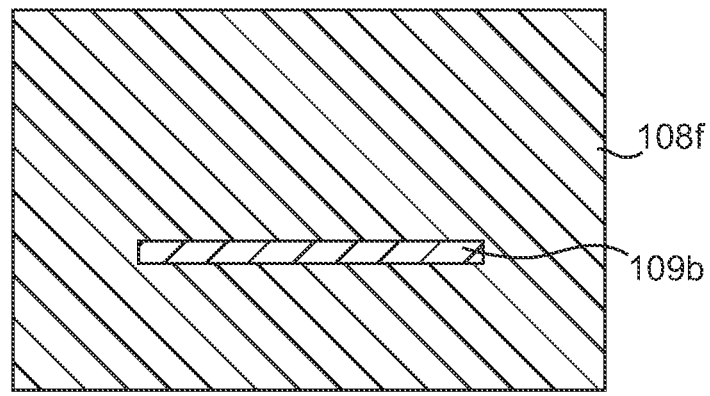
FIG. 15 illustrates a cross-sectional view of another embodiment of the substrate and the etched sacrificial material layer after depositing an epitaxial layer.

The embodiment illustrated by FIG. 15 follows the process previously described and illustrated with reference to FIG. 7. FIG. 15 illustrates a cross-sectional view of one embodiment of a substrate 108f and etched sacrificial material layer 109b after depositing an epitaxial layer. A semiconductor material, such as Si or another suitable semiconductor material is deposited over substrate 108*a* and sacrificial material layer 109*b* using selective epitaxy to provide substrate 108*f*. In this embodiment, substrate 108*f* is not etched to provide an opening 111 as previously described and illustrated with reference to FIG. 9-11.

While the embodiments illustrated and described in the following FIGS. 16A-19 use substrate 108*f* and sacrificial material layer 109*b* previously described and illustrated with reference to FIG. 15, the embodiments are also applicable to the embodiments previously described and illustrated with reference to FIGS. 8-14.

Figure 16A:
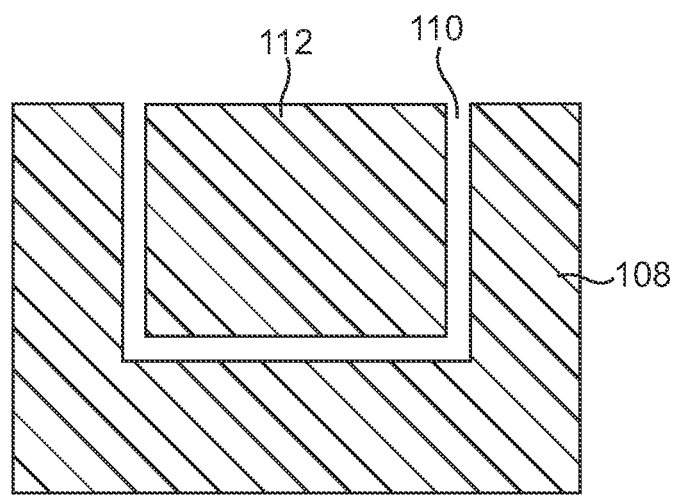
FIG. 16A illustrates a cross-sectional view of one embodiment of the substrate and a mass element after etching the substrate and removing the etched sacrificial material layer.
Figure 16B:
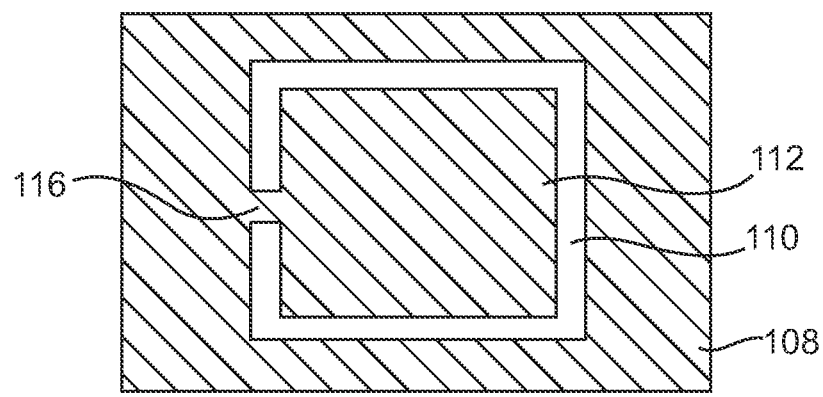
FIG. 16B illustrates a top view of one embodiment of the substrate and the mass element after etching the substrate and removing the etched sacrificial material layer.

FIG. 16A illustrates a cross-sectional view and FIG. 16B illustrates a top view of one embodiment of substrate 108 and a mass element 112. Substrate 108*f* is etched to expose portions of sacrificial material layer 109*b* to provide mass element 112 and substrate 108. In one embodiment, a deep trench etch is used to expose portions of sacrificial material layer 109*b*. Mass element 112 remains connected to substrate 108 via a narrow semiconductor material portion as indicated at 116. Sacrificial material layer 109*b* is then removed to provide cavity 110. Sacrificial material layer 109*b* is removed using a wet etch or another suitable etch. In another embodiment, sacrificial material layer 109*b* is not etched and the trenches are filled or partially filled with additional sacrificial material, which is removed later in the fabrication process.

Figure 17:
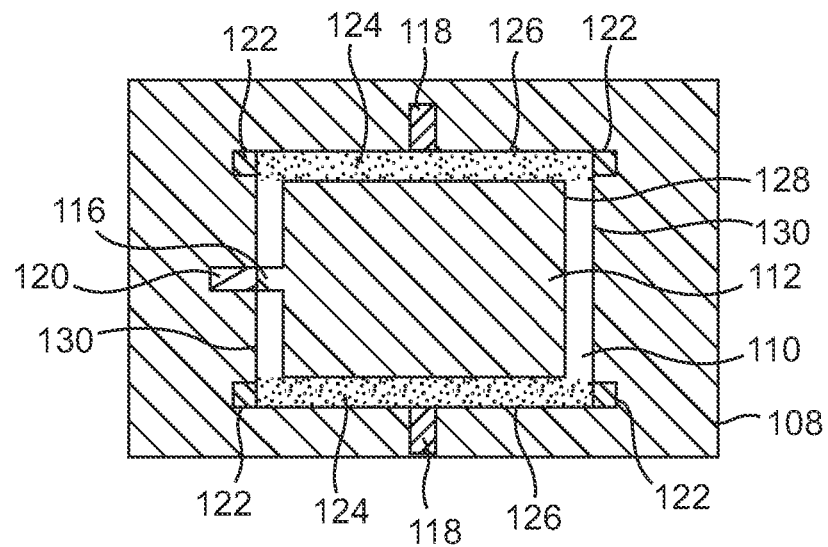
FIG. 17 illustrates a top view of one embodiment of the substrate and the mass element after doping.

FIG. 17 illustrates a top view of one embodiment of substrate 108 and mass element 112 after doping. The sidewalls of mass element 112 are doped to provide doped sidewalls 128. The sidewalls of substrate 108 in cavity 110 are doped to provide doped sidewalls 126 and 130. In one embodiment, sidewalls 128 of mass element 112 and sidewalls 126 and 130 of substrate 108 are n doped. Portions of substrate 108 are also doped to provide connections 118 to sidewalls 126 of substrate 108 and connection 120 to sidewalls 128 of mass element 112. Connections 118 and 120 electrically couple doped sidewalls 126 and 128 to circuits within the ASIC. In one embodiment, connections 118, and 120 are n doped.

Portions 124 of the bottom of cavity 110 between sidewalls 128 of mass element 112 and sidewalls 126 of substrate 108 are doped to electrically isolate sidewalls 126 from sidewalls 128. In one embodiment, portions 124 of the bottom of cavity 110 are p doped. Portions of substrate 108 at the corners of cavity 110 between sidewalls 126 and 130 of substrate 108 are doped to provide doped corners 122. In one embodiment, corners 122 are p doped. Doped corners 122 electrically isolate doped sidewalls 126 from doped sidewalls 130. In another embodiment, the polarities of sidewalls 126, 128, and 130, portions 124 of the bottom of cavity 110, connections 118 and 120, and corners 122 are reversed, such that sidewalls 126, 128, and 130 and connections 118 and 120 are p doped, and portions 124 of the bottom of cavity 110 and corners 122 are n doped. Substrate 108 and mass element 112 are doped using deposition diffusion and/or an angled implantation and/or another suitable doping process.

Figure 18:
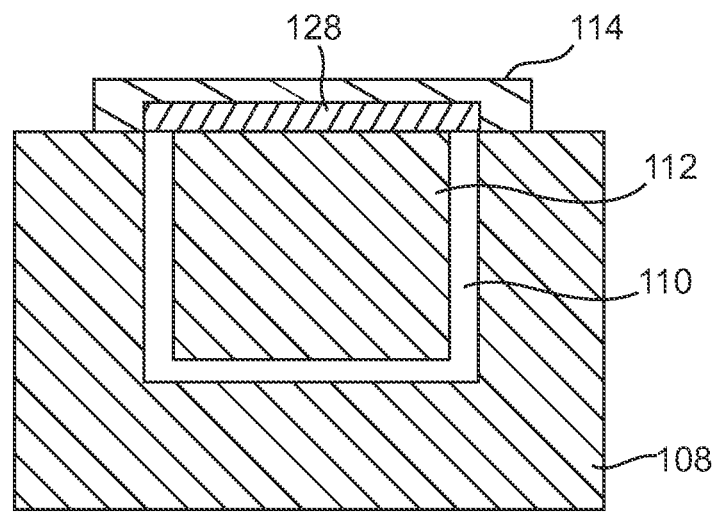
FIG. 18 illustrates a cross-sectional view of one embodiment of the substrate, the mass element, an oxide layer, and a polysilicon or another suitable material layer.

FIG. 18 illustrates a cross-sectional view of one embodiment of substrate 108, mass element 112, an oxide layer 128, and a polysilicon or another suitable material layer 114. An oxide, such as $SiO_2$ or another suitable sacrificial material is grown or deposited over substrate 108 and mass element 112 to provide an oxide layer. In one embodiment, the oxide layer is then etched to expose portions of substrate 108 to provide oxide layer 128. Polysilicon or another suitable material is deposited over exposed portions of substrate 108 and oxide layer 128 to provide a polysilicon layer or another suitable material layer. In one embodiment, the polysilicon or other suitable material layer is then etched to expose portions of substrate 108 to provide layer 114.

Figure 19:
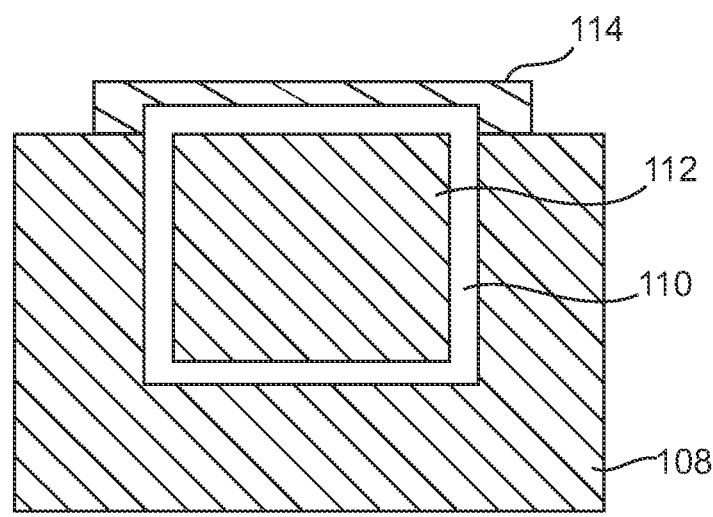
FIG. 19 illustrates a cross-sectional view of one embodiment of the substrate, the mass element, and the polysilicon or other suitable material layer after removing the oxide layer.

FIG. 19 illustrates a cross-sectional view of one embodiment of substrate 108, mass element 112, and layer 114 after removing oxide layer 128. Oxide layer 128 is removed to provide a gap between layer 114 and mass element 112. In one embodiment, oxide 128 is removed by etching a hole through layer 114 and wet etching oxide layer 128. In one embodiment, where sacrificial material is deposited in the trenches, the sacrificial material is now also removed. The hole through layer 114 is then sealed to provide acceleration sensor 106*a* previously described and illustrated with reference to FIGS. 3A and 3B. In one embodiment, a CMOS circuit is then fabricated on substrate 108 to provide an ASIC as previously described and illustrated with reference to FIG. 2.

Figure 20A:
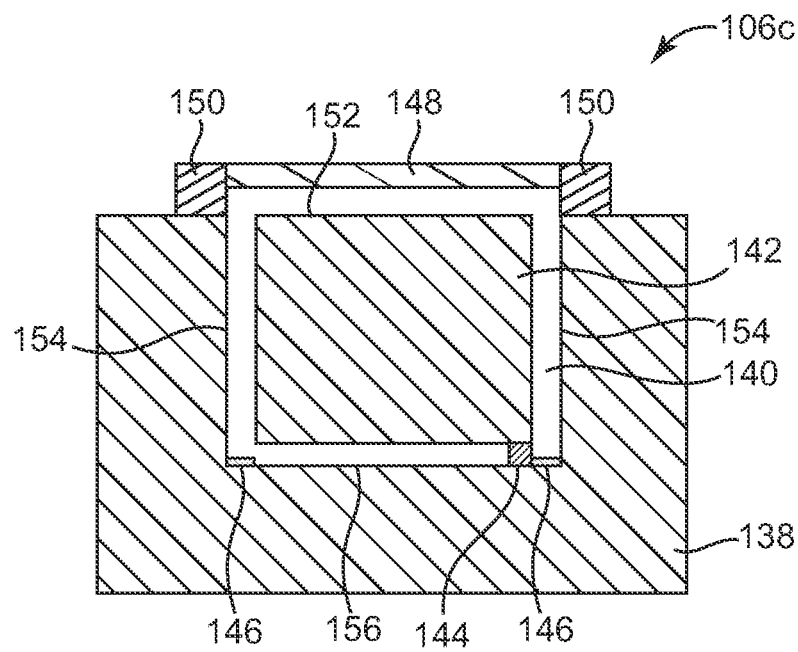
FIG. 20A illustrates a cross-sectional view of another embodiment of an acceleration sensor.
Figure 20B:
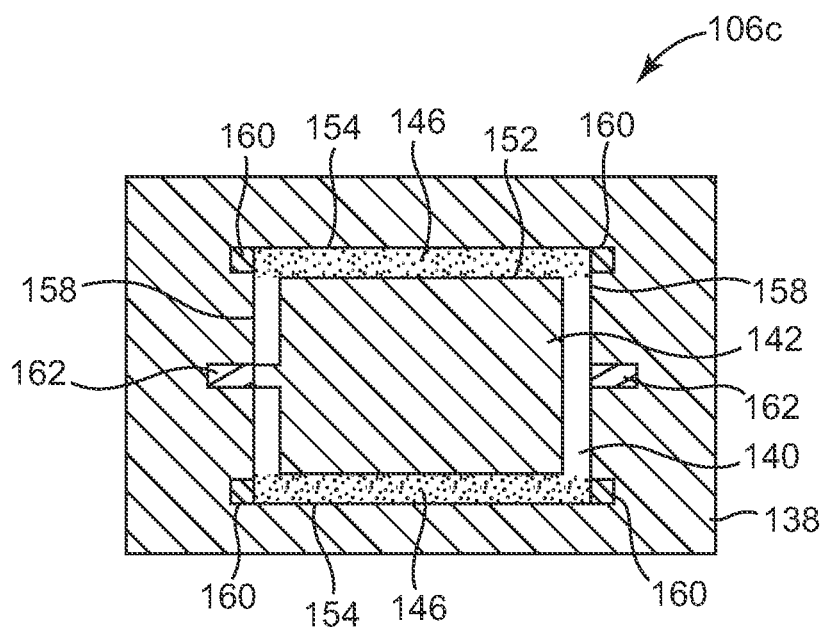
FIG. 20B illustrates a top view of another embodiment of the acceleration sensor.

FIG. 20A illustrates a cross-sectional view and FIG. 20B illustrates a top view of another embodiment of an acceleration sensor 106*c*. In one embodiment, acceleration sensor 106*c* provides acceleration sensor 106 previously described and illustrated with reference to FIG. 2. Acceleration sensor 106*c* includes a substrate 138, a cavity 140, a mass element 142, and a doped polysilicon or another suitable material cap 148 and 150. In one embodiment, portion 148 of the cap is n doped, and portions 150 of the cap are p doped.

Mass element 142 is connected to substrate 138 by a narrow silicon portion as indicated at 144. The narrow semiconductor portion as indicated at 144 is located at any suitable location between substrate 138 and mass element 142 such that mass element 142 is free to move on the desired axis for measuring the acceleration on the desired axis. While mass element 142 in the illustrated embodiment is substantially square or rectangular in shape, in other embodiments mass element 142 has other suitable shapes. Mass element 142 moves within cavity 140 in response to changes in applied acceleration.

Sidewalls 154 of substrate 138 in cavity 140 are perpendicular to sidewalls 158 of substrate 138 in cavity 140. Sidewalls 154 and 158 of substrate 138 in cavity 140 are parallel and opposite to sides 152 of mass element 142. Sides 152 of mass element 142 are doped. In one embodiment, the sides 152 of mass element 142 are n doped. Sidewalls 154 of substrate 108 and the bottom 156 of cavity 140 are doped to have the same polarity as sides 152 of mass element 142. In one embodiment, sidewalls 154 and bottom 156 are n doped.

Portions 146 of the bottom of cavity 140 between sides 152 of mass element 142 and sidewalls 154 of substrate 138 are doped to have the polarity opposite the polarity of sidewalls 154 and 158. In one embodiment, portions 146 of the bottom of cavity 140 between sidewalls 152 of mass element 142 and sidewalls 154 of substrate 138 are p doped. Corners 160 between sidewalls 154 and 158 of substrate 138 are doped to have the same polarity as portions 146 of the bottom of cavity 140 to electrically isolate sidewalls 154 from sidewalls 158. In one embodiment, corners 160 between sidewalls 154 and 158 of substrate 138 are p doped.

Connections 162 electrically couple sidewalls 158 to a circuit for measuring the movement of mass element 142. Connections 162 are doped to have the same polarity as sidewalls 158. In one embodiment, connections 162 are n doped. Connection 144 electrically couples sides 152 of mass element 142 to the circuit for measuring the movement of mass element 142. Connection 144 is doped to have the same polarity as sides 152. In one embodiment, connection 144 is n doped. In another embodiment, the polarities of sides 152, sidewalls 154 and 158, bottom 156 of cavity 140, portions 146 of the bottom of cavity 142, connections 144 and 162, and corners 160 are reversed, such that sides 152, sidewalls 154 and 158, bottom 156 of cavity 140, and connections 144 and 162 are p doped, and portions 146 of the bottom of cavity 140 and corners 160 are n doped.

Doped sidewalls 158 of substrate 108 and doped sidewall 152 opposite each doped sidewall 158 provide electrodes for two capacitors for sensing movement of mass element 142. In addition, doped cap 148 and doped side 152 of mass element 142 opposite doped cap 148 provide electrodes for a capacitor for sensing movement of mass element 142. In response to an applied acceleration, mass element 142 moves. The movement of mass element 142 is sensed by measuring a change in capacitance between sides 152 of mass element 142 and sidewalls 158 of substrate 138 and cap 148.

The following FIGS. 21-26 illustrate embodiments of a method for fabricating an acceleration sensor, such as acceleration sensor 106c previously described and illustrated with reference to FIGS. 20A and 20B. To begin, the process previously described and illustrated with reference to FIGS. 5 and 6 is performed.

Figure 21:
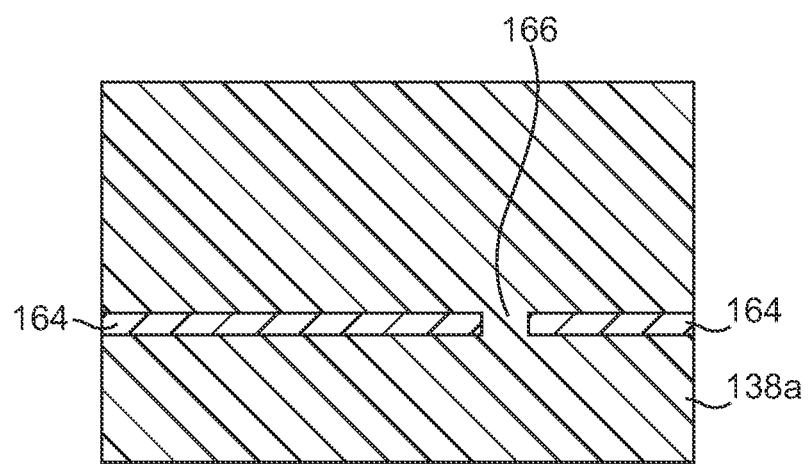
FIG. 21 illustrates a cross-sectional view of one embodiment of a substrate and an etched sacrificial material layer after depositing an epitaxial layer.

FIG. 21 illustrates a cross-sectional view of one embodiment of a substrate 138a and an etched sacrificial material layer 164 after depositing an epitaxial layer. Sacrificial material layer 109a is etched to expose a portion of substrate 108a to provide etched sacrificial material layer 164. A semiconductor material, such as Si or another suitable semiconductor material is deposited over sacrificial material layer 164 using selective epitaxy to provide substrate 138a.

Figure 22:
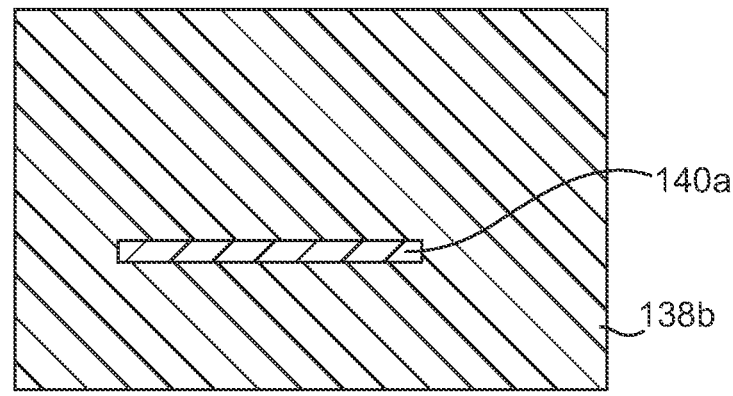
FIG. 22 illustrates a cross-sectional view of another embodiment of the substrate and the etched sacrificial material layer after depositing an epitaxial layer.

The embodiment illustrated by FIG. 22 follows the process previously described and illustrated with reference to FIG. 7. FIG. 22 illustrates a cross-sectional view of one embodiment of a substrate 138b and a sacrificial material layer 140a. A semiconductor material, such as Si or another suitable semiconductor material is deposited over substrate 108a and sacrificial material layer 140a using selective epitaxy to provide substrate 138b.

While the embodiments illustrated and described in the following FIGS. 23A-26 use substrate 138b and sacrificial material layer 140a previously described and illustrated with reference to FIG. 22, the embodiments are also applicable to the embodiment previously described and illustrated with reference to FIG. 21 and the silicon on nothing embodiment previously described and illustrated with reference to FIG. 11.

Figure 23A:
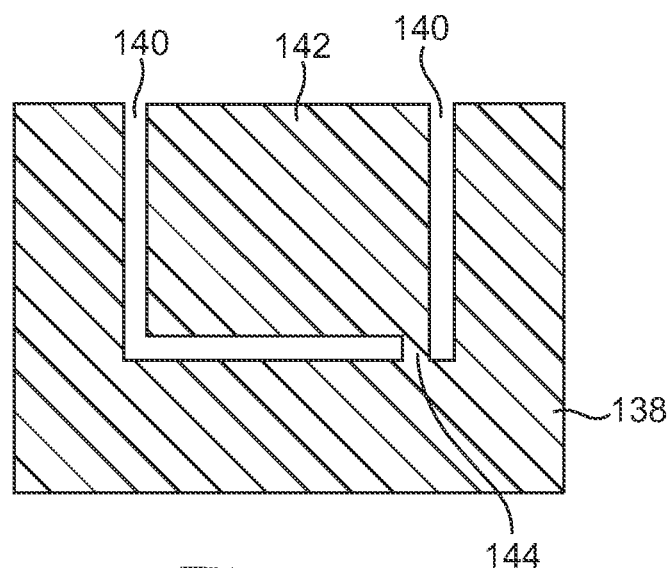
FIG. 23A illustrates a cross-sectional view of one embodiment of the substrate and a mass element after etching the substrate and removing the etched sacrificial material layer.
Figure 23B:
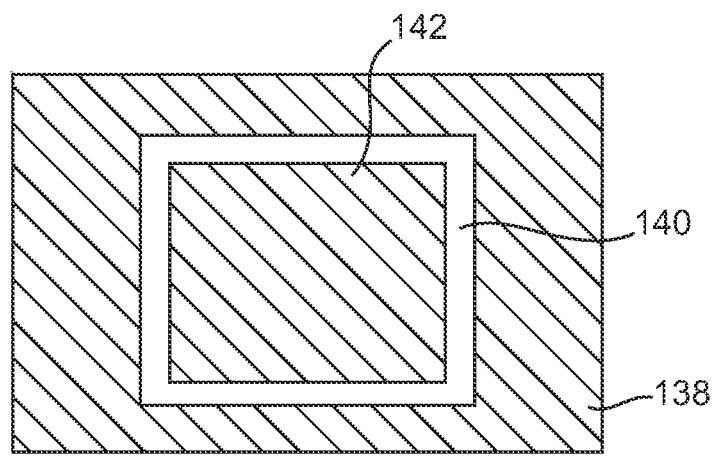
FIG. 23B illustrates a top view of one embodiment of the substrate and the mass element after etching the substrate and removing the etched sacrificial material layer.

FIG. 23A illustrates a cross-sectional view and FIG. 23B illustrates a top view of one embodiment of substrate 138 and a mass element 142. Substrate 138b is etched to expose portions of sacrificial material layer 140a to provide mass element 142 and substrate 138. In one embodiment, a deep trench etch is used to expose portions of sacrificial material layer 140a. Mass element 142 remains connected to substrate 138 via a narrow semiconductor material portion as indicated at 144. Sacrificial material layer 140a is then removed to provide cavity 140. Sacrificial material layer 140a is removed using a wet etch or another suitable etch. In another embodiment, sacrificial material layer 140a is not etched and the trenches are filled or partially filled with additional sacrificial material, which is removed later in the fabrication process.

Figure 24:
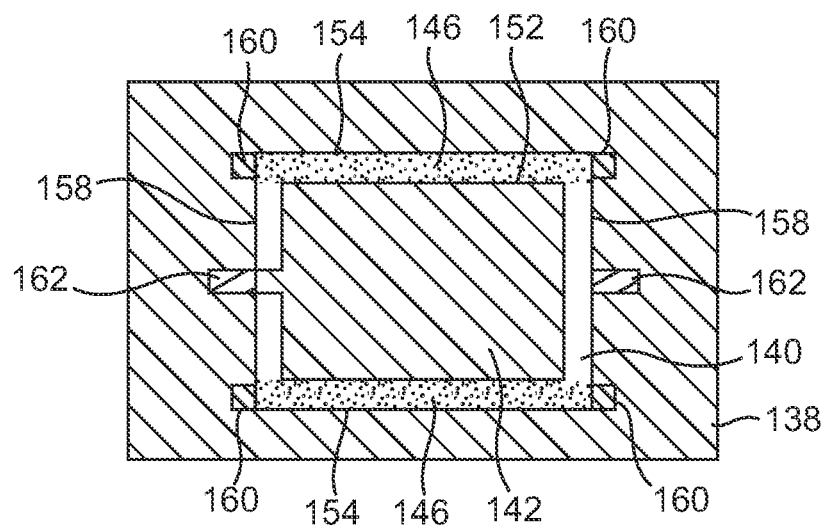
FIG. 24 illustrates a top view of one embodiment of the substrate and the mass element after doping.

FIG. 24 illustrates a top view of one embodiment of substrate 138 and mass element 142 after doping. The sidewalls of mass element 142 are doped to provide doped sidewalls 152. The sidewalls of substrate 138 in cavity 140 are doped to provide doped sidewalls 154 and 158. In one embodiment, sidewalls 152 of mass element 142 and sidewalls 154 and 158 of substrate 138 are n doped. Portions of substrate 138 are also doped to provide connections 162 to sidewalls 158 of substrate 138. Connections 162 electrically coupled doped sidewalls 158 to a circuit within the ASIC. In one embodiment, connections 162 are n doped.

Portions 146 of the bottom of cavity 140 between sidewalls 152 of mass element 142 and sidewalls 154 of substrate 138 are doped to electrically isolate sidewalls 154 from sidewalls 152. In one embodiment, regions 146 are p doped. Portions of substrate 138 at the corners between sidewalls 154 and 158 of substrate 138 are doped to provide doped corners 160. In one embodiment, corners 160 are p doped. Doped corners 160 electrically isolate doped sidewalls 154 from doped sidewalls 158. In another embodiment, the polarities of sidewalls 152, 154, and 158, connections 162, portions 146 of the bottom of cavity 140, and corners 160 are reversed, such that sidewalls 152, 154, and 158 and connections 162 are p doped, and portions 146 of the bottom of cavity 140 and corners 160 are n doped. Substrate 138 and mass element 142 are doped using deposition diffusion and/or an angled implantation and/or another suitable doping process.

Figure 25:
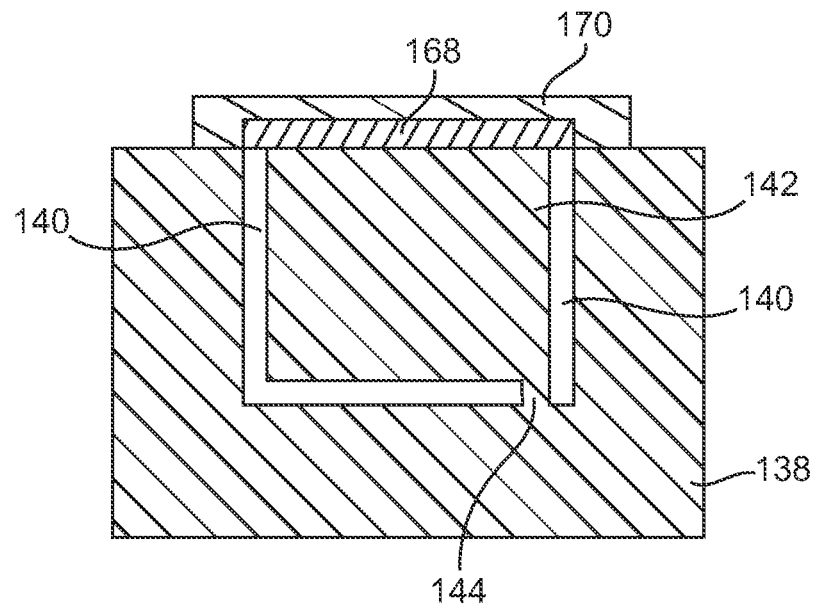
FIG. 25 illustrates a cross-sectional view of one embodiment of the substrate, the mass element, an oxide layer, and a polysilicon or another suitable material layer.

FIG. 25 illustrates a cross-sectional view of one embodiment of substrate 138, mass element 142, an oxide layer 168, and a polysilicon or another suitable material layer 170. An oxide, such as $SiO_2$ or another suitable sacrificial material is grown or deposited over substrate 138 and mass element 142 to provide an oxide layer. In one embodiment, the oxide layer is then etched to expose portions of substrate 138 to provide oxide layer 168. Polysilicon or another suitable material is deposited over exposed portions of substrate 138 and oxide layer 168 to provide a polysilicon or another suitable material layer. In one embodiment, the polysilicon or other suitable material layer is then etched to expose portions of substrate 168 to provide layer 170.

Figure 26:
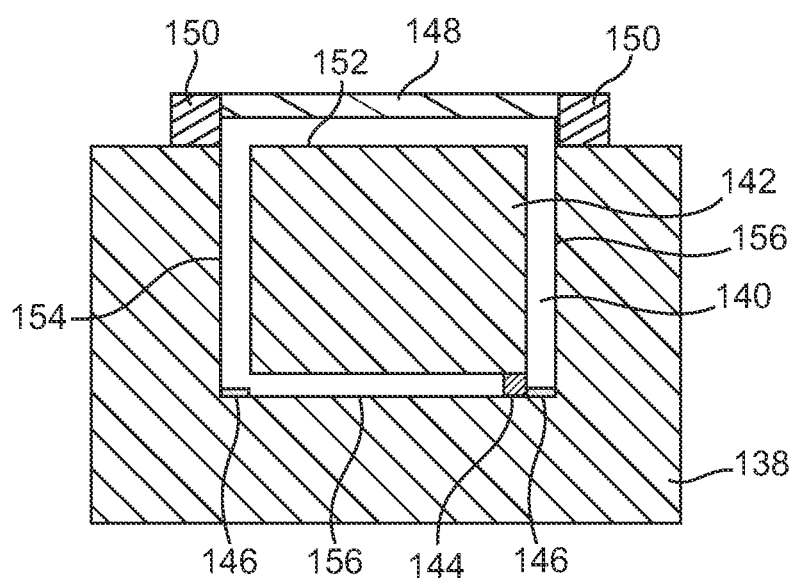
FIG. 26 illustrates a cross-sectional view of one embodiment of the substrate, the mass element, and the polysilicon or other suitable material layer after removing the oxide layer and doping the polysilicon or other suitable material layer.

FIG. 26 illustrates a cross-sectional view of one embodiment of substrate 138, mass element 142, and layer 148 and 150 after removing oxide layer 168 and doping layer 170. Oxide layer 168 is removed to provide a gap between layer 170 and mass element 142. In one embodiment, oxide 168 is removed by etching a hole through layer 170 and wet etching oxide layer 168. In one embodiment, where sacrificial material is deposited in the trenches, the sacrificial material is now also removed. The hole through layer 170 is then sealed. Layer 170 is then doped to provide doped layer 148 and 150 to provide acceleration sensor 106c previously described and illustrated with reference to FIGS. 20A and 20B. In one embodiment, polysilicon or other suitable material 148 is n doped and polysilicon or other suitable material 150 is p doped.

Embodiments provide acceleration sensors fabricated on the same substrate as CMOS circuits to provide one chip ASIC solutions for sensing acceleration. The one chip solution reduces costs compared to separate sensor and logic chips that are combined to provide an acceleration sensor package.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a semiconductor substrate;
   a semiconductor mass element configured to move in response to an applied acceleration, the mass element defined by trenches etched into the semiconductor substrate and a cavity below the mass element, a bottom of the cavity defined by semiconductor substrate material; and a sensing element configured to sense movement of the mass element.

2. The semiconductor device of claim 1, wherein the sensing element comprises a capacitive sensing element.

3. The semiconductor device of claim 2, wherein the sensing element comprises a doped sidewall of the mass element and a doped sidewall of the substrate opposite the doped sidewall of the mass element.

4. The semiconductor device of claim 1, further comprising:

a capping layer contacting the substrate and capping the mass element, the capping layer separated from the mass element by a gap.

5. The semiconductor device of claim 4, wherein the sensing element comprises a capacitive sensing element comprising a doped portion of the capping layer and a doped top of the mass element.

6. The semiconductor device of claim 4, wherein the capping layer comprises polysilicon.

7. The semiconductor device of claim 4, wherein a top of the capping layer is coplanar with a top of the substrate.

8. The semiconductor device of claim 1, wherein the mass element is connected to the substrate via a semiconductor material portion between a sidewall of the mass element and a sidewall of the substrate.

9. The semiconductor device of claim 1, wherein the mass element is connected to the substrate via a semiconductor material portion between a bottom of the mass element and a bottom of the cavity.

10. The semiconductor device of claim 1, wherein a portion of the bottom of the cavity defined by the semiconductor substrate material is doped to electrically isolate a sidewall of the mass element from a sidewall of the substrate opposite to the sidewall of the mass element.

11. The semiconductor device of claim 1, further comprising:

a circuit formed on the substrate.

12. A method for fabricating a semiconductor device, the method comprising:

depositing a sacrificial material directly on a semiconductor substrate;

depositing a semiconductor material directly on the sacrificial material, the semiconductor material comprising a material different from the sacrificial material;

etching trenches into the semiconductor material to expose portions of the sacrificial material;

etching the sacrificial material after etching the trenches to provide a cavity below a portion of the semiconductor material to provide a mass element from the semiconductor material defined by the trenches and the cavity; and fabricating a sensing element configured to sense movement of the mass element.

13. The method of claim 12, wherein depositing the sacrificial material comprises depositing an oxide.

14. The method of claim 12, wherein depositing the sacrificial material comprises depositing SiGe.

15. The method of claim 12, wherein fabricating the sensing element comprises fabricating a capacitive sensing element.

16. The method of claim 15, wherein fabricating the capacitive sensing element comprises doping a sidewall of the mass element and a sidewall of a trench opposite the sidewall of the mass element.

17. The method of claim 12, further comprising:

fabricating a capping layer contacting the semiconductor material and capping the mass element and separated from the mass element by a gap.

18. The method of claim 17, wherein fabricating the capping layer comprises:

depositing an oxide over the semiconductor material and the mass element;

depositing polysilicon over the oxide; and removing the oxide to provide the capping layer from the polysilicon.

19. The method of claim 12, further comprising:

fabricating a circuit on the semiconductor material.

20. A method for fabricating a semiconductor device, the method comprising:

forming a cavity in a semiconductor substrate using a silicon on nothing process;

etching trenches into the substrate to expose portions of the cavity and to provide a mass element defined by the trenches and the cavity, a bottom of the cavity defined by semiconductor substrate material; and fabricating a sensing element configured to sense movement of the mass element.

21. The method of claim 20, wherein fabricating the sensing element comprises fabricating a capacitive sensing element.

22. The method of claim 21, wherein fabricating the capacitive sensing element comprises doping a sidewall of the mass element and a sidewall of a trench opposite the sidewall of the mass element.

23. The method of claim 20, further comprising:

fabricating a capping layer contacting the semiconductor material and capping the mass element and separated from the mass element by a gap.

24. The method of claim 20, further comprising:

doping a portion of the bottom of the cavity defined by the semiconductor substrate material to electrically isolate a sidewall of the mass element from a sidewall of the substrate opposite to the sidewall of the mass element.

25. The method of claim 20, further comprising:

fabricating a circuit on the substrate.

* * * * *